United States Patent [19]

Lim

[11] 4,153,862
[45] May 8, 1979

[54] SELF-REGULATING DEFLECTION CIRCUIT WITH RESISTIVE DIODE BIASING

[75] Inventor: Chong C. Lim, Hamilton Square, N.J.

[73] Assignee: RCA Corporation, New York, N.Y.

[21] Appl. No.: 897,031

[22] Filed: Apr. 17, 1978

[51] Int. Cl.² .......................................... H01J 29/70
[52] U.S. Cl. .................................................. 315/408
[58] Field of Search ......................................... 315/408

[56] References Cited

U.S. PATENT DOCUMENTS

| 3,898,523 | 8/1975 | Wessel | 315/408 |
| 3,906,307 | 9/1975 | Hattum | 315/408 |
| 3,912,971 | 10/1975 | Houkes | 315/408 |
| 3,912,972 | 10/1975 | Stacker | 315/408 X |
| 3,950,674 | 4/1976 | Joosten et al. | 315/408 X |
| 4,001,607 | 1/1977 | Dietz | 315/408 X |
| 4,024,434 | 5/1977 | Joosten et al. | 315/408 X |
| 4,099,101 | 7/1978 | Teuling | 315/408 |

OTHER PUBLICATIONS

"A New Horizontal Output Deflection Circuit" by Peter L. Wessel, IEEE Transactions on Broadcast and Television Receivers, vol. BTR-18, #3, Aug. 1972.

*Primary Examiner*—Malcolm F. Hubler
*Attorney, Agent, or Firm*—Eugene M. Whitacre; Paul J. Rasmussen; William H. Meise

[57] ABSTRACT

A self-regulating deflection circuit includes a first inductor and switching transistor coupled across the unregulated voltage supply. A damper diode, retrace capacitor and second inductor are coupled in parallel, and the parallel combination is coupled across the transistor by a first rectifier poled to prevent current from flowing from the first inductor to the second inductor. A second rectifier is coupled between the first and second inductors for transferring energy from the first inductor to the second during the retrace interval. A control circuit coupled to the second inductor and to the base of the switching transistor controls the time during the first half of the trace interval during which the transistor conducts to allow energy to be stored in the first inductor. A storage capacitor is coupled in series with the second rectifier. Charge accumulation on the storage capacitor and resultant blocking of the second rectifier is prevented by a resistor coupled across the storage capacitor.

7 Claims, 2 Drawing Figures

SELF-REGULATING DEFLECTION CIRCUIT WITH RESISTIVE DIODE BIASING

BACKGROUND OF THE INVENTION

This invention relates to self-regulating horizontal deflection circuits with diode steering in which one of the diodes is biased.

Horizontal deflection circuits are used in conjunction with television picture tubes in television display devices. Typically, the horizontal deflection circuit includes a magnetic winding associated with the picture tube and a switching circuit by which energy from a dc voltage source is coupled to the winding and its associated reactances. The switching circuit is synchronized with synchronizing signals associated with the information content of the video to be displayed on the picture tube. In order to avoid distorted images on the displayed raster, the size of the horizontal scanning line and the peak deflection or scanning current must be maintained constant over substantial periods of time.

Many conditions can cause the size of the horizontal scanning line to vary. If the direct energizing voltage for the horizontal deflection circuit varies, the scanning energy and hence the width of the horizontal scanning line may vary. It has in the past been customary to regulate the direct voltage applied to the horizontal deflection circuit by the use of a dissipative regulator. Requirements for low power consumption in television receivers is reducing the use of such dissipative regulators in favor of nondissipative types.

Another approach to regulating the scan width involves the use of a self-regulating deflection circuit, such as is described in the article "A New Horizontal Output Deflection Circuit" by Peter L. Wessel, which appeared in the IEEE Transactions on Broadcast and Television Receivers, August, 1972, Vol. BTR-18, No. 3, pages 117-182. The Wessel deflection circuit may be energized from an unregulated direct voltage, and uses a single switching transistor to perform the switching function for the horizontal deflection and for nondissipative switching regulation. In the Wessel circuit, the unregulated direct voltage is applied across the primary winding of a transformer by the switching transistor. The deflection winding, retrace capacitor and damper diode associated with the horizontal deflection are coupled across the collector-emitter path of the switching transistor by a first diode poled for conduction in the same direction as the collector-emitter path. A secondary winding of the transformer is coupled across the deflection winding by a second diode poled to conduct and transfer energy from the primary to the deflection winding during the retrace interval. It is desirable to eliminate the secondary winding, and thereby reduce the total number of windings.

A horizontal deflection circuit in which the secondary winding is eliminated is described in U.S. Pat. No. 3,906,307 issued Sept. 16, 1975 in the name of J. Van Hattum. However, in the Van Hattum arrangement, an additional inductor and capacitor are used. The necessity for the additional inductor negates the advantage of elimination of the secondary winding.

SUMMARY OF THE INVENTION

A self-regulating deflection circuit includes a first inductor and controllable switch serially coupled across a source of unregulated direct voltage to form a first series path for storing energy in the first inductance during the intervals in which the switch is conductive. A first rectifier couples a parallel combination of elements across the switch, the parallel combination including a second inductance, a damper diode and retrace capacitor. The first rectifier is poled for current conduction in the same direction as the switch. A control circuit coupled to the second inductance and with the switch recurrently operates the switch for promoting current flow in the second inductance during recurrent trace and retrace intervals, and maintains the peak value of the current flow at a constant level. A second rectifier is coupled by a second capacitance with the parallel combination of elements and to a point on the first series path for transferring energy from the first inductance to the parallel combination of elements during the retrace intervals. A resistance is coupled to the second capacitance for equalizing charge on the second capacitance during the trace interval.

DESCRIPTION OF THE INVENTION

Figure 1:
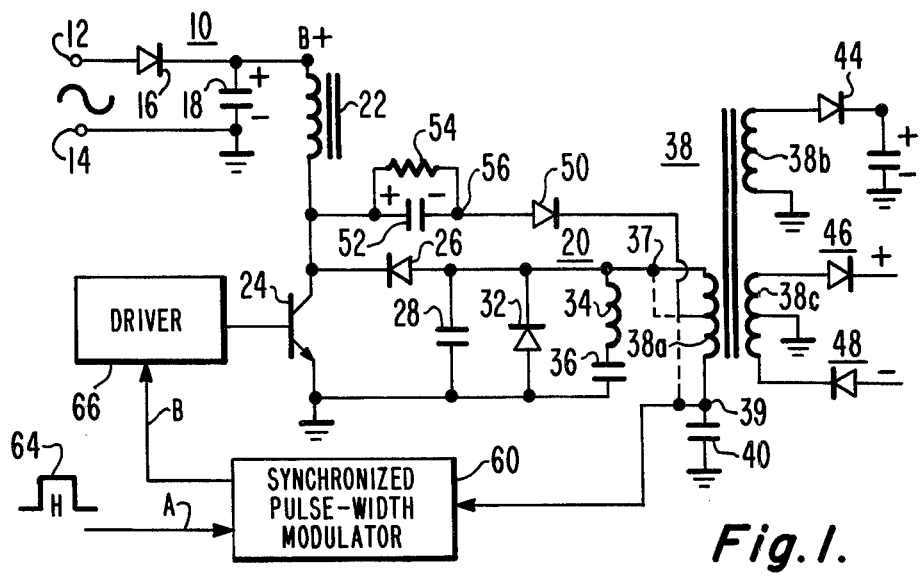
FIG. 1 illustrates partially in block and partially in schematic form a portion of the deflection circuit of a television display device embodying the invention.

In FIG. 1, a power supply designated generally as 10 includes a rectifier represented by a diode 16 and a filter capacitor 18 coupled to terminals 12 and 14 adapted to be coupled to the alternating-current power mains. Unregulated direct voltage appearing across capacitor 18 energizes a horizontal deflection circuit designated generally as 20.

Deflection generator 20 includes an inductor 22 connected at one end to capacitor 18 and at the other end to the collector of an NPN switching transistor 24, the emitter of which is connected to ground. The cathode of a diode 26 is connected to the collector of transistor 24, and its anode is connected to the cathode of a damper diode 32, the anode of which is connected to ground. A retrace capacitor 28 is coupled in parallel with diode 32. A deflection winding 34 is serially coupled with an S-shaping capacitor 36, and the serial combination is coupled in parallel with capacitor 28. A primary winding 38a of a transformer 38 is coupled at a terminal 37 with the anode of diode 26. The other end of primary winding 38a is connected at a terminal 39 with one end of a storage capacitor 40, the other end of which is grounded. A high-voltage secondary winding 38b of transformer 38 has one end grounded and the other end connected to an ultor rectifier represented as a diode 44 for producing high voltage for application to the ultor of a kinescope, not shown. Another secondary winding 38c of transformer 38 has a grounded center-tap and the ends connected to rectifier diodes 46 and 48 for producing operating voltages for the low-voltage portions, not shown, of the television device.

A dc blocking capacitor 52 is serially connected with a diode 50, and the serial combination is coupled between the collector of transistor 24 and a point on winding 38a. The cathode of diode 50 is connected to winding 38a, and the anode is coupled to the collector of transistor 24. A resistor 54 has one end connected to capacitor 52 at a circuit point 56, and the other end is coupled to the end of capacitor 52 remote from point 56 so as to form a parallel connection.

A synchronized pulse-width modulator illustrated as a block 60 is coupled to capacitor 40 for sampling the voltage appearing thereacross. Modulator 60 receives horizontal synchronizing pulses illustrated as 64 at an input terminal A. Modulator 60 produces pulses in known manner, the time duration or width of which are controlled in response to the voltage across capacitor 40, and the pulses are applied by way of a conductor B to a driver circuit illustrated as a block 66. Driver 66 replicates or, if desired, shapes the pulses in a known manner and applies them to the base of switching transistor 24 to control its collector-emitter conduction in a switching manner.

Figure 2:
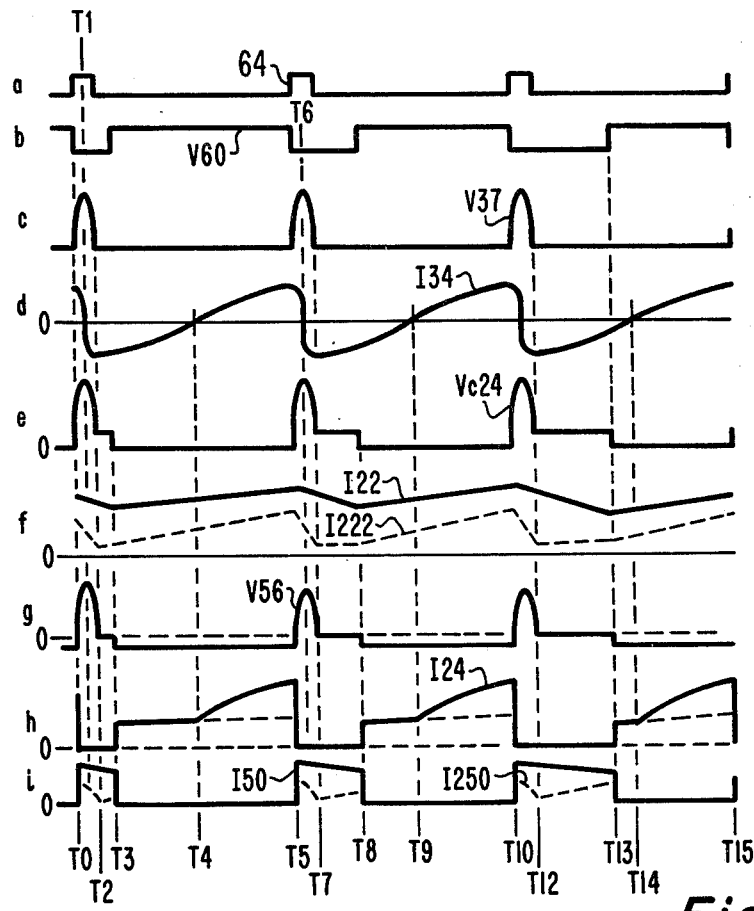
FIG. 2 illustrates voltage-and current-time waveforms occurring in the arrangement of FIG. 1 during operation.

The waveforms of FIG. 2 in the intervals T0-T5, T5-T10 and T10-T15 exemplify operation for low, correct, and excessive deflection energy, respectively. The interval T4-T10 is representative and will be used to describe details of the circuit operation.

In operation during the last half of the horizontal scanning or trace intervals preceding time T5, the collector-emitter path of transistor 24 is conductive, and current is increasing in inductor 22 as illustrated by waveform I22 of FIG. 2f in the interval following time T4. The current in inductor 22 flows through the collector-emitter path of transistor 24. During this same interval immediately following the time T4, which is the time of the center of the horizontal trace interval, current is flowing in deflection winding 34 as illustrated by waveform I34 of FIG. 2d, and is increasing under the impetus of the voltage on capacitor 36. The current in winding 34 flows through diode 26 and adds to the collector-emitter current flowing in transistor 24, as illustrated by waveform I24 of FIG. 2h. A current flows through winding 38a under the impetus of the voltage on capacitor 40, which current adds to the deflection current flowing through diode 26 and transistor 24. Winding 38a is in parallel with winding 34 and they may be viewed as being a single inductor through which a single current proportional to the deflection current flows. In the interval between times T4 and T5, diode 50 is reversed-biased by a voltage, poled as shown, on capacitor 52.

The deflection current and the current in inductor 22 continues to increase until a time such as T5 at which a horizontal synchronizing pulse 64 as illustrated in FIG. 2a is applied to modulator 60. Modulator 60 responds by producing a transition of voltage V60 on conductor B as illustrated in FIG. 2b. Voltage V60 causes driver 66 to render the collector-emitter path of transistor 24 nonconductive. This initiates the retrace interval, which extends from time T5 to T7. During the first portion T5-T6 of the retrace interval, winding 34 (together with winding 38a) transfers the energy stored in its magnetic field to capacitor 28 in a resonant manner, causing the voltage at circuit point 37 to rise as illustrated by V37 of FIG. 2c.

The voltage at terminal point 39 remains substantially unchanged during the retrace interval because of the filtering effect of capacitor 40. Consequently, the voltage at a point along winding 38a will rise during the retrace interval in an amount depending upon how remote the point is from circuit point 39. Thus, the voltage at the cathode of diode 50 will depend upon the exact point on winding 38a at which the cathode is connected.

When transistor 24 is rendered nonconductive at time T5, the voltage across inductor 22 rises so as to maintain the current of transistor 24 therefore rises and forces the current through capacitor 52 and forward-biased diode 50 to winding 38a and capacitor 40, resulting in an energy transfer thereto. The voltage across inductor 22 during the retrace interval determines the rate at which energy is transferred during this interval from winding 22 to winding 38a and the remainder of the deflection circuit. The voltage across winding 22 during this interval is the algebraic sum of the voltage which is then on capacitors 18, 40 and 52, the voltage produced by the inductance of winding 38a, and the forward voltage drop of diode 50. During this retrace interval, voltage is coupled from winding 38a to windings 38b and 38c for rectification and energization of the remainder of the television device.

The first half of the retrace interval ends at a time T6 as the current in windings 34 and 38a is reduced to zero and the voltage on retrace capacitor 28 peaks. Voltage V37 represents the voltage across the retrace capacitor. During the second half of the retrace interval, diode 50 continues to conduct a decreasing current as illustrated by I50 of FIG. 2i as energy is transferred to winding 38a and capacitor 40 from winding 22. Also during the second half of the retrace interval, the current in windings 34 and 38a reverses and increases to a peak at a time 27 as illustrated by I34. As the current in winding 34 increases to a peak in the negative direction, the voltage at circuit point 37 decreases towards zero as illustrated by V37 of FIG. 2c. The retrace interval ends at a time T7 as V37 reaches zero and damper diode 32 conducts.

During the first half T7-T9 of the following trace interval, the current in winding 34 decreases as its energy is transferred to capacitor 36. During a first portion T7-T8 of the trace interval, transistor 24 is maintained nonconductive. The remaining energy in winding 22 continues to cause current to flow through capacitor 52 and diode 50. The collector voltage VC24 of transistor 24 during this interval is maintained at a voltage equal to the algebraic sum of the voltage on capacitors 40 and 52, the voltage caused by winding 38a, and the forward junction potential of diode 50, as illustrated in FIG. 2e.

At a time T8, modulator 60 produces a gating pulse V60 which is coupled to transistor 24 to render it conductive. When transistor 24 becomes conductive, its collector goes to ground potential, coupling winding 22 across capacitor 18 to commence the energy storage portion of the deflection cycle. At the same time, the positive end of capacitor 52 is coupled to ground, placing a negative potential as illustrated by V56 of FIG. 2g on the anode of diode 50, which cuts it off. During the remainder of the trace interval, the increasing current in winding 22 flows through the collector-emitter path of transistor 24.

At a time T9, the deflection current in winding 34 reaches zero, and capacitor 36 has reached its maximum potential. Diode 32 becomes nonconductive. The voltage at junction point 37 rises until diode 26 becomes conductive, and current begins to flow through deflection winding 34 under the impetus of the voltage on capacitor 36. This current flows through diode 26 and the collector-emitter path of transistor 24, as illustrated by I24. The currents in windings 22 and 34 continue to increase until the end T10 of the deflection interval, at which time transistor 24 is rendered nonconductive to create a retrace voltage pulse at circuit point 37 and cause energy transfer from winding 22 to winding 38a.

In the interval between times T5 and T10, modulator 60 produces a gating pulse V60 rendering transistor 24 conductive at times during the first half of trace interval. During the interval T5-T8 in which transistor 24 is nonconductive, current in inductor 22 decreases and energy is transferred therefrom into winding 38a and capacitor 40. In the interval T8-T10 in which transistor 24 is conductive, current increases in winding 22 as it stores energy derived from the unregulated direct voltage. Time T8 is selected as that time which results in the peak value of current I22 being equal from one horizontal cycle to the net so as to maintain substantially the same transfer of energy from winding 22 to the deflection components in order to compensate for the losses during the deflection cycle. These losses include dissipative losses and energy transferred to the kinescope ultor.

In the event that the losses during successive deflection cycles exceed the energy transferred from inductor 22, less energy than desired will circulate through deflection system during each cycle, resulting in reduced raster width. The voltage across capacitor 40 will decrease as a result of this decreased energy and modulator 60 will produce a gating waveform V60 at a time T3 occurring earlier during the deflection cycle than corresponding time T8. This reduces the time T0-T3 in which current I22 decreases, and increases the interval T3-T5 in which voltage is applied to inductor 22 in a polarity to increase the current. Consequently, at a time T5 at the end of the deflection interval, the energy stored in the magnetic field of inductor 22, as measured by current I22, will exceed that at time T0. This results in an increased energy transfer which restores the circulating energy and the voltage across capacitor 40.

Similarly, when the loads on winding 38a decrease and the circulating energy increases, the voltage on capacitor 40 will increase, and modulator 60 will gate transistor 24 into conduction at a time T13 which is later relative to the deflection cycle than time T8. This allows a greater time T10-T13 in which current I22 can decrease and reduces the time T13-T15 in which the current can increase, thereby resulting in reduced current in inductor 22 at the end of the deflection cycle and reduced energy available for transfer to the deflection components, thereby restoring the voltage across capacitor 40 and maintaining the raster width. Time T13 at which transistor 24 is rendered conductive cannot be selected later than time T14 of the center of scan, because of the resulting raster distortion.

The point on winding 38a at which the cathode of diode 50 is connected may be selected at the end of winding 38a corresponding to circuit point 39. Substantial regulation results at all points along winding 38a to which the cathode of diode 50 may be connected. However, some changes in the waveforms occur. Current I222 of FIG. 2f represents the current in winding 22 when the cathode of diode 50 is coupled to circuit point 37, and current I250 of FIG. 2i represents the corresponding current in diode 50.

In the absence of resistor 54, the unidirectional current flow through capacitor 52 and diode 50 will tend to raise the voltage across capacitor 52 to a very high value in the polarity shown. If charge is allowed to accumulate on capacitor 52 in this manner, the voltage across capacitor will soon equal the maximum voltage which can occur at the collector of transistor 24, and diode 50 will cease to conduct during the retrace intervals, no energy will be transferred to the deflection components to compensate for the losses during the deflection cycle, and the circuit will cease to operate.

Resistor 54 is provided as a path for preventing accumulation of excess charge across capacitor 52. As the voltage across capacitor 52 increases, the rate at which charge is drained away through resistor 54 also increases. The end of resistor 52 remote from circuit point 56 can be coupled to any point of reference potential, such as B+ or ground, in order to achieve the desired discharge of capacitor 52. Reduced power dissipation results from coupling resistor 54 in parallel with capacitor 52, as illustrated in FIG. 1. With this arrangement, circuit point 56 takes on a negative potential during those portions of the horizontal scanning interval in which transistor 24 is conductive as illustrated by V56.

Other embodiments of the invention will be apparent to those skilled in the art. In particular, the positions of serially coupled diode 50 and capacitor 52 may be interchanged. Impedance-matching considerations may require either the collector of transistor 24 or the serial combination of diode 50 and capacitor 52 to be coupled to a tap on winding 22.

What is claimed is:
1. A self-regulating deflection circuit adapted to be energized from a source of unregulated direct voltage, said deflection circuit including
first inductance means;
controllable switch means including a unidirectional main current conducting path and a control electrode, said main current controlling path being serially coupled with said first inductance means across the source of unregulated direct voltage thereby forming a first series path for storing energy in said first inductance means during those intervals in which said main current conducting path is conductive;
first rectifier means;
a parallel combination of elements coupled by said first rectifier means across said main current conducting path, said parallel combination including second inductance means, damper diode means and retrace capacitance means, said first rectifier means being poled for current conduction in the same direction as said main current conducting path;
control means coupled with said second inductance means and with said control electrode for recurrently switching said main current conducting path for promoting current flow in said second inductance means during recurrent trace and retrace intervals and for maintaining the peak value of said current flow at a constant level;
second capacitance means;
second rectifier means coupled by said capacitance means with said parallel combination of elements and to a point on said first series path for transferring energy from said first inductance means to said parallel combination of elements during said retrace intervals;
wherein the improvement comprises
resistance means coupled with said second capacitance means for equalizing charge on said second capacitance means during said trace interval.
2. A circuit according to claim 1 wherein said resistance means is coupled in parallel with said second capacitance means.
3. A circuit according to claims 1 or 2 wherein said capacitance means is serially coupled with said second rectifier means.

4. A circuit according to claim 3 wherein said point on said first series path is a point along said first inductance means.

5. A circuit according to claim 4 wherein said point along said first inductance means is an end of said first inductance means.

6. A circuit according to claims 1 or 2 wherein said second rectifier means is coupled by said capacitance means with said second inductance means in said parallel combination of elements.

7. A circuit according to claims 1 or 2 wherein said second inductance means is a winding of a transformer and said second inductance means is paralleled by a deflection winding.

* * * * *

UNITED STATES PATENT AND TRADEMARK OFFICE
CERTIFICATE OF CORRECTION

PATENT NO. : 4,153,862

DATED : May 8, 1979

INVENTOR(S) : Chong C. Lim

It is certified that error appears in the above-identified patent and that said Letters Patent is hereby corrected as shown below:

Column 3, line 68, after "current" add -- in winding 22. The voltage at the collector --; Column 4, line 25, that portion reading "27" should read -- T7 --; Column 5, line 10, that portion reading "net" should read -- next --.

Signed and Sealed this

Fourteenth Day of August 1979

[SEAL]

Attest:

LUTRELLE F. PARKER

Attesting Officer    Acting Commissioner of Patents and Trademarks